US012772449B2

(12) United States Patent
Fazil et al.

(10) Patent No.: US 12,772,449 B2
(45) Date of Patent: Oct. 20, 2026

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Damir Fazil, Boise, ID (US); John D. Hopkins, Meridian, ID (US); Indra V. Chary, Boise, ID (US); Tom John, Boise, ID (US); Joel D. Peterson, Boise, ID (US); Kar Wui Thong, Boise, ID (US); Zhaohui Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 693 days.

(21) Appl. No.: 17/747,126

(22) Filed: May 18, 2022

(65) Prior Publication Data

US 2023/0380159 A1 Nov. 23, 2023

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ......... H10B 43/27; H10B 41/27; H10B 43/10
See application file for complete search history.

(56) References Cited

U.S. PATENT DOCUMENTS

| | | | | |
|---|---|---|---|---|
| 11,251,190 | B2 | 2/2022 | Hopkins et al. | |
| 11,282,847 | B2 | 3/2022 | Hopkins et al. | |
| 12,230,325 | B2 | 2/2025 | Scarbrough et al. | |
| 2002/0036313 | A1 | 3/2002 | Yang et al. | |
| 2020/0161325 | A1* | 5/2020 | Clampitt | H10D 62/151 |
| 2020/0295040 | A1* | 9/2020 | Tobioka | H01L 21/31144 |
| 2021/0358939 | A1* | 11/2021 | Hopkins | H10B 41/10 |
| 2022/0149061 | A1* | 5/2022 | Hopkins | H10B 43/27 |
| 2022/0149067 | A1 | 5/2022 | Hopkins et al. | |

OTHER PUBLICATIONS

Scarbrough et al., U.S. Appl. No. 17/747,166, filed May 18, 2022, titled "Memory Arrays Comprising Strings of Memory Cells and Methods Used in Forming a Memory Array Comprising Strings of Memory Cells", 51 pages.

* cited by examiner

*Primary Examiner* — Michele Fan
(74) *Attorney, Agent, or Firm* — Wells St. John P.S.

(57) ABSTRACT

A memory array comprises strings of memory cells. The memory array comprises laterally-spaced memory blocks that individually comprise a vertical stack comprising alternating insulative tiers and conductive tiers directly above a conductor tier. Channel-material strings of memory cells extend through the insulative tiers and the conductive tiers. The channel material of the channel-material strings directly electrically couples to conductor material of the conductor tier. Individual ones of the channel-material strings in a vertical cross-section comprise an external jog surface that is above the conductor tier and an internal jog surface that is in the conductor tier. Other aspects, including methods, are disclosed.

12 Claims, 17 Drawing Sheets

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a “0” or a “1”. In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called “stair-step structure” at an end or edge of an array of the vertically-stacked memory cells. The stair-step structure includes individual “stairs” (alternately termed “steps” or “stair-steps”) that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called “gate-last” or “replacement-gate” processing, so-called “gate-first” processing, and other processing whether existing or future-developed independent of when transistor gates are formed. Embodiments of the invention also encompass integrated circuitry comprising a memory array comprising strings of memory cells (e.g., NAND architecture) independent of method of manufacture. First example method embodiments are described with reference to FIGS. 1-29.

Figure 1:
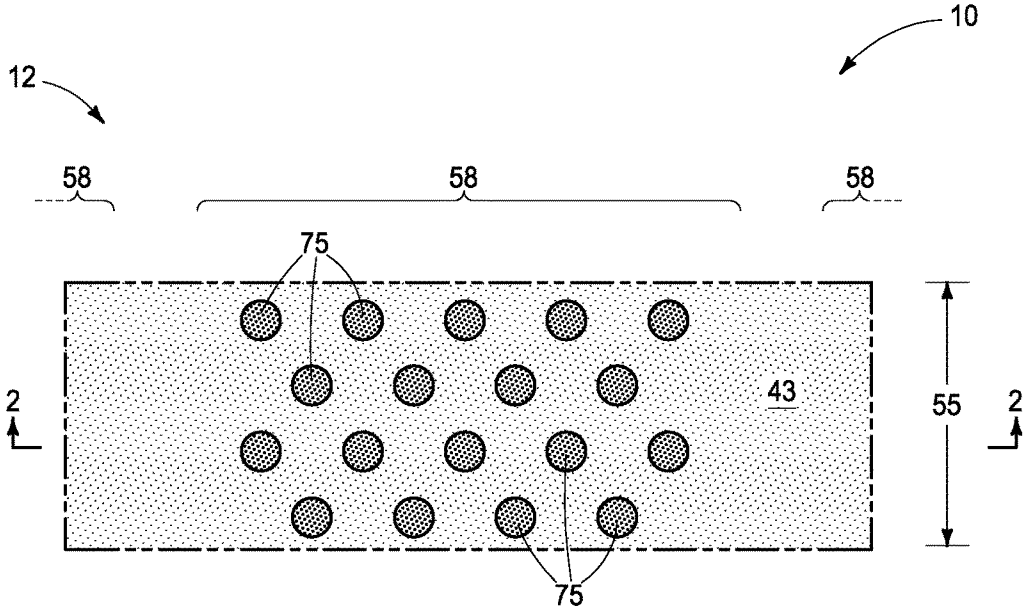
FIGS. 1-2 are diagrammatic cross-sectional views of portions of a construction that will comprise an array of elevationally-extending strings of memory cells in accordance with an embodiment of the invention.
Figure 2:
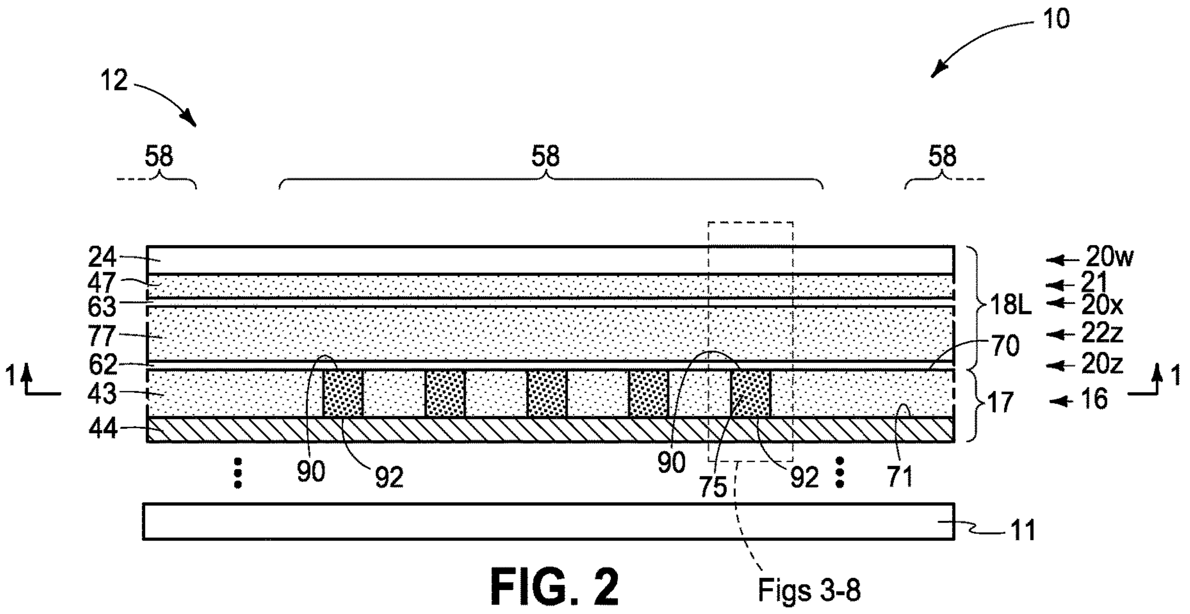

FIGS. 1-2 show an example construction 10 having an array 12 in which elevationally-extending strings of transistors and/or memory cells will be formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a “sub-array” may also be considered as an array.

A conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped silicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12. Conductor tier 16 may be considered as having a top surface 70. Top surface 70 comprises conductor material 17 (e.g., upper conductor material 43). Lower conductor material 44 may be considered as having a top surface 71. Either or both of surfaces 70 and 71 may be planar.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, unless otherwise indicated, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20*z* of second tiers 20* directly above (e.g., directly against) conductor material 17. Example lowest second tier 20*z* is insulative and may be sacrificial (e.g., comprising material 62, for example silicon dioxide and/or silicon nitride). A next-lowest second tier 20*x* of second tiers 20* is directly above lowest second tier 20*z* and may be sacrificial (e.g., comprising material 63, for example silicon dioxide and/or silicon nitride). A lowest tier 22*z* of first tiers 22* comprising sacrificial material 77 (e.g., polysilicon or silicon nitride) is vertically between lowest second tier 20*z* and next-lowest second tier 20*x*. In one embodiment, lower portion 18L comprises a conducting tier 21 comprising conducting material 47 (e.g., conductively-doped polysilicon) that is directly above next-lowest second tier 20*x*. Example lower portion 18L comprises an upper second tier 20*w* (e.g., a next-next lowest second tier) comprising insulative material 24 (e.g., silicon dioxide). Additional tiers may be present. For example, one or more additional tiers may be above tier 20*w* (tier 20*w* thereby not being the uppermost tier in portion 18L, and not shown), between tier 20*w* and conducting tier 21 (not shown), and/or below tier 22*z* (other than 20*z* not being shown). In one embodiment, lower portion 18L at least as initially formed comprises multiple first/conductive tiers (e.g., 22*z* and 21) tiers and multiple second/insulative tiers (e.g., 20*z*, 20*x*, 20*w*). In one embodiment and as shown, upper second tier 20*w* is the uppermost second tier 20* in lower portion 18L.

Figure 3:
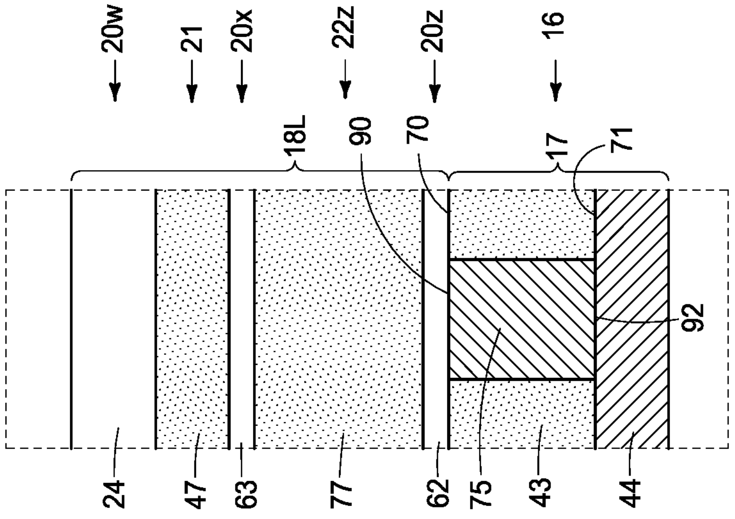

Referring to FIGS. 1-3, conductor tier 16 comprises sacrificial plugs 75 in locations where individual channel-material strings will be formed. Sacrificial plugs 75 individually have a top surface 90 that is at or below top surface 70 of conductor tier 16 and are of different composition from an upper portion of conductor material 17 (e.g., material 43). Top surface 70 of conductor tier 16 can be planar immediately-adjacent sacrificial plugs 75. Top surface 70 of individual ones of sacrificial plugs 75 may be coplanar with planar top surface 70 of the conductor tier 16. Sacrificial plugs 75 individually have a bottom surface 92 that is at or above a top surface 71 of lower conductor material 44. Sacrificial plugs 75 can also be of a different composition from top surface 71 of the lower conductor material 44.

Sacrificial plugs 75 may be formed, by way of example, by etching openings into conductor material 17, filling said openings with plug material and planarizing the plug material back. The composition of sacrificial plugs 75 may be conductive, semiconductive, and/or insulative whereby sacrificial plugs 75 are overall one of conductive, semiconductive, or insulative. In at least one embodiment, the composition of sacrificial plugs 75 includes one or more of W, borophosphosilicate glass (BPSG), and/or AlOx (e.g., $Al_2O_3$). Sacrificial plugs 5 may be formed to have a portion (e.g., bottom surface 92) directly against top surface 71 of the metal material 44.

Some embodiments of plugs 75 are diagrammatically depicted in FIGS. 3-8. Referring first to FIG. 3, sacrificial plugs 75 may be uniform in composition and individually have a portion above a top surface 71 of metal material (e.g., 44).

Figure 4:
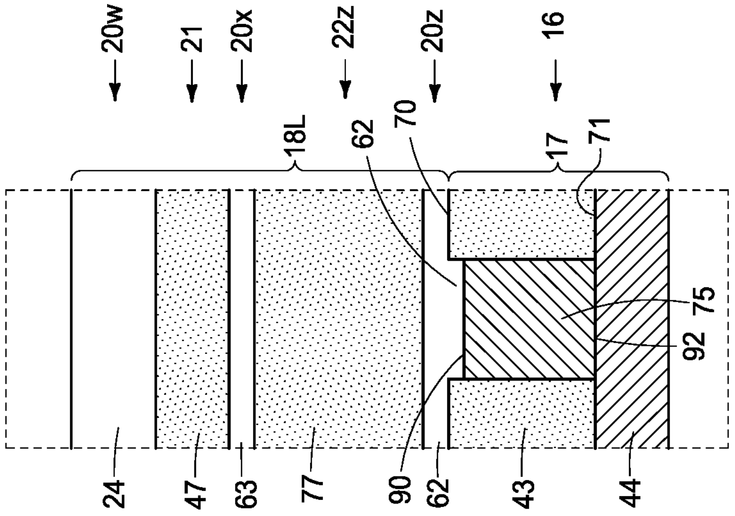
FIGS. 3-8 are diagrammatic cross-sectional views of embodiments of sacrificial plugs within the portions of FIGS. 1-2.

Referring to FIG. 4, top surface 90 of sacrificial plug 75 can also be recessed to be below top surface 70 of conductor tier 16. Accordingly, material 62 is above top surface 90 of sacrificial plug 75. Sacrificial plugs 75 may be a different composition than material 62. For example, sacrificial plug 75 may be W, and material 62 may be an oxide such as silicon dioxide.

Figure 5:
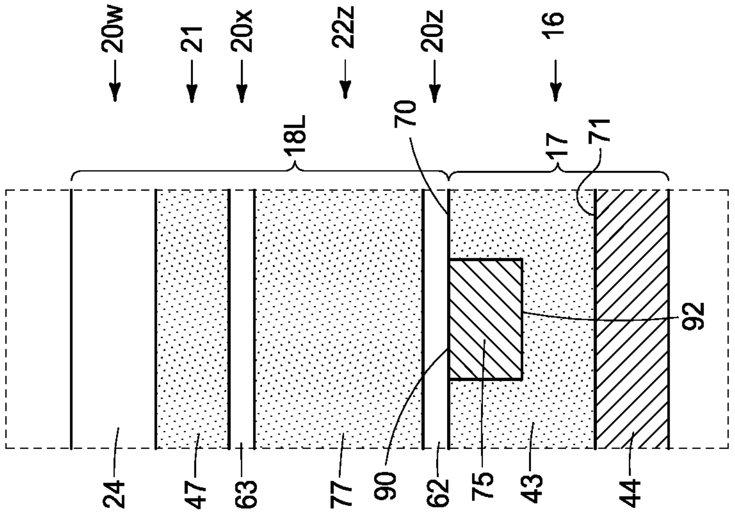

Referring next to FIG. 5, conductor material 17 comprises conductively-doped semiconductive material 43 directly above and directly against metal material 44. Sacrificial plugs 75 are formed to have portion 92 above top surface 71 of the metal material 44. Conductively-doped semiconductive material 43 may be between sacrificial plug 75 and metal material 44 within conductor tier 16.

Figure 6:
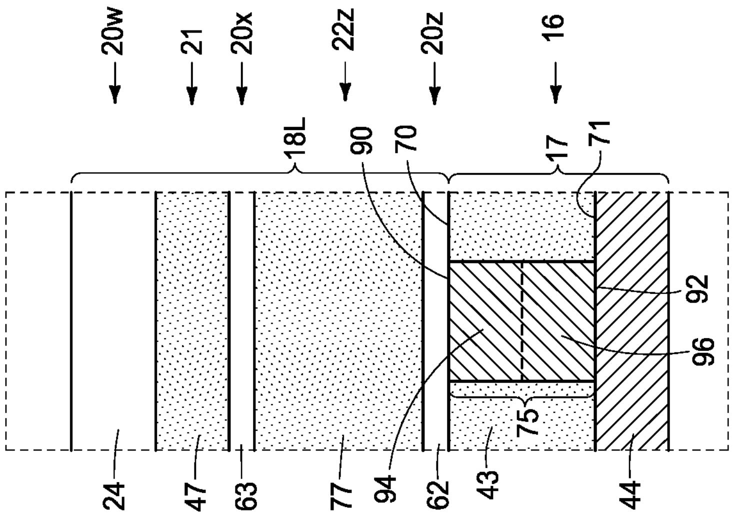

Referring next to FIG. 6, in accordance with another embodiment, one or more of the sacrificial plugs 75 can comprise two different compositions, 94 and 96, for example. While represented as upper portion 94 and a lower portion 96, the different compositions can be lateral of one another and/or one bounded by another. Upper portion 94 includes top surface 90 and lower portion 96 includes bottom surface 92. As examples, portion 94 can comprise BPSG and portion 96 can comprise W. In accordance with another implementation, portion 94 can comprise AlOx and portion 96 can comprise W.

Figure 7:
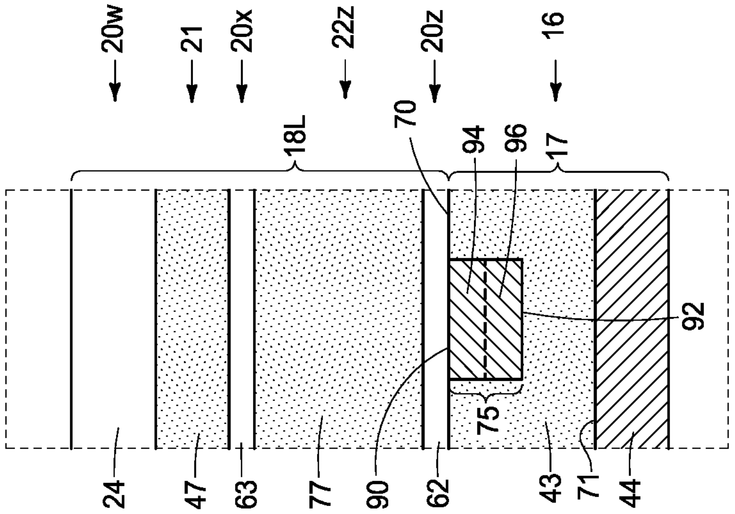

Referring next to FIG. 7, sacrificial plug 75 can include upper portion 94 and lower portion 96, with bottom surface 92 of lower portion 96 being above top surface 71 of lower conductor material 44. In accordance with another embodiment (not shown), upper portion 94 may be recessed and top surface 90 may be below top surface 70 of conductor tier 16.

Figure 8:
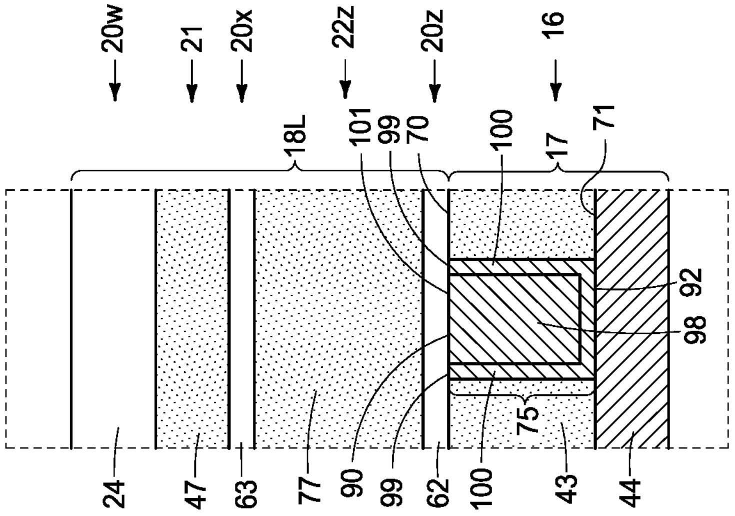

Referring next to FIG. 8, in accordance with another embodiment, one of two different compositions are sidewalls 100 of at least one of the sacrificial plugs 75, and the other of the two different compositions 98 is between sidewalls 100 of at least one of sacrificial plugs 75. For example, sidewalls 100 may comprise W and composition 98 may comprise BPSG or AlOx. Sidewalls 100 can have a top surface 99 immediately-adjacent top surface 70. Top surface 99 can also be immediately-adjacent top surface 101 of composition 98 between sidewalls 100. In accordance with example implementations, one or both of compositions 98 and 100 may be recessed to provide top surface 101 and/or top surface 99 below top surface 70 of conductor tier 16. According to another implementation, bottom surface 92 of sidewall 100 may be above top surface 71 of lower conductor material 44.

Figure 9:
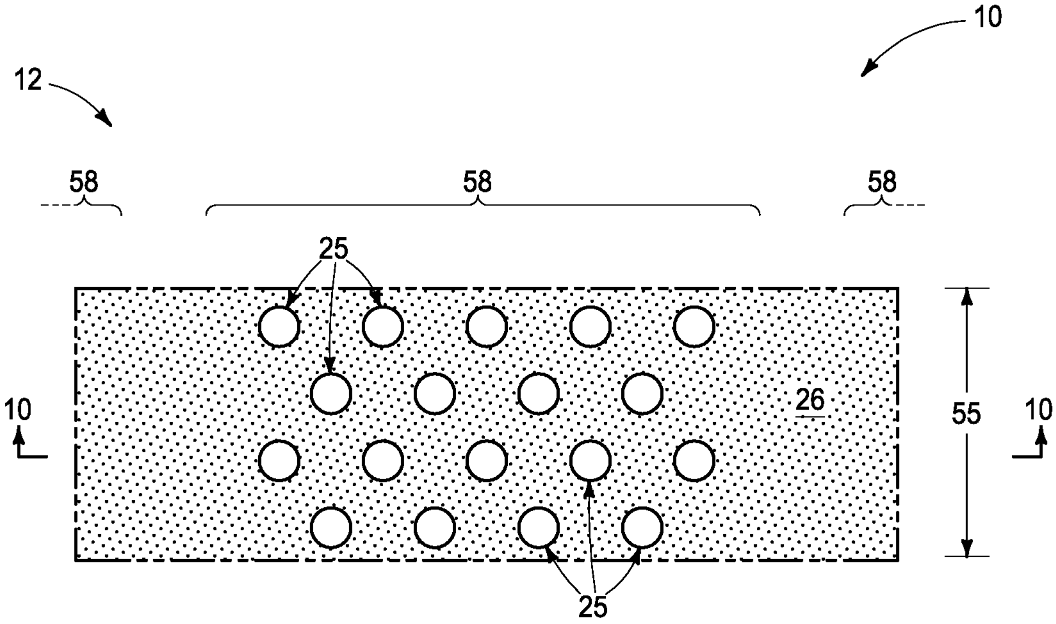
FIGS. 9-29 are diagrammatic sequential sectional and/or enlarged views of the construction of FIGS. 1-2, or portions thereof or alternate and/or additional embodiments, in process in accordance with some embodiments of the invention.
Figure 10:
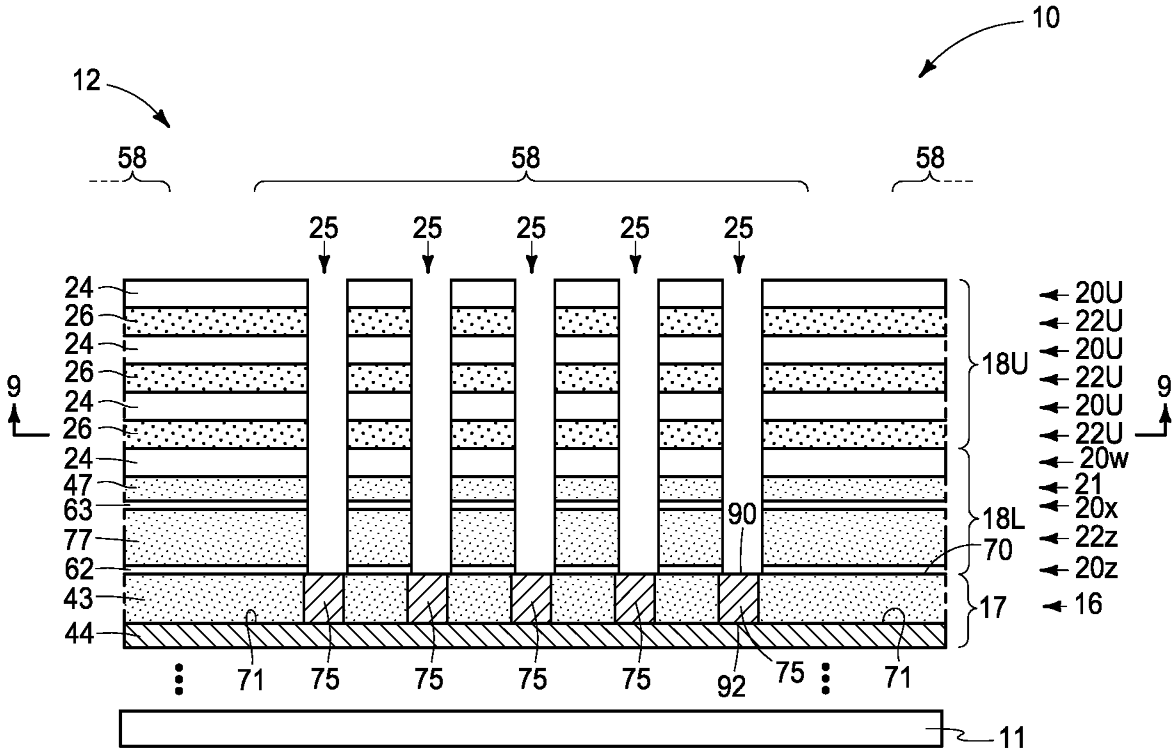
Figure 11:
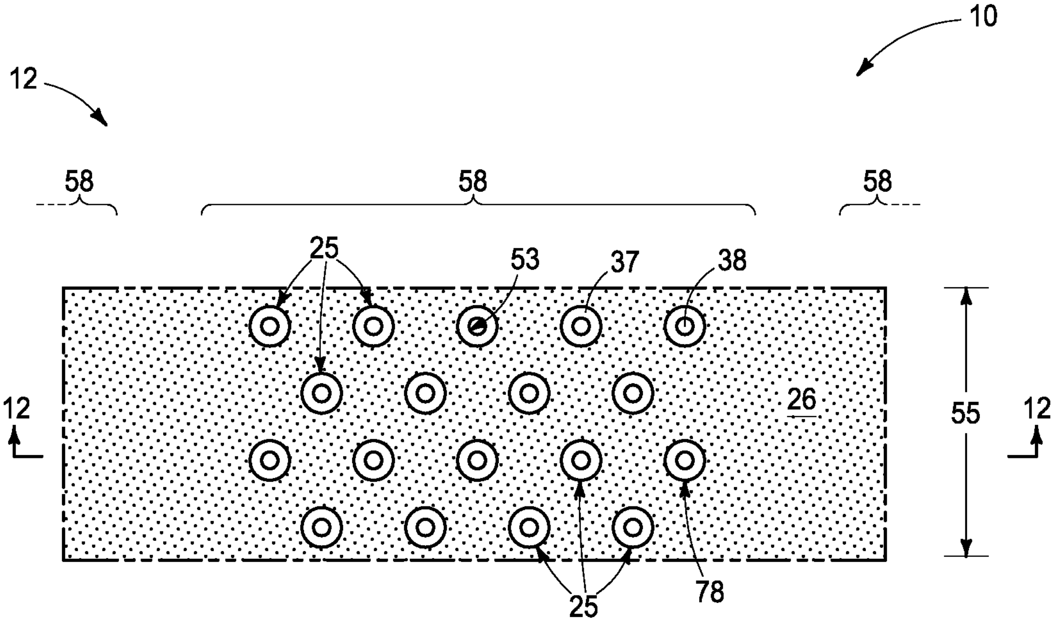
Figure 12:
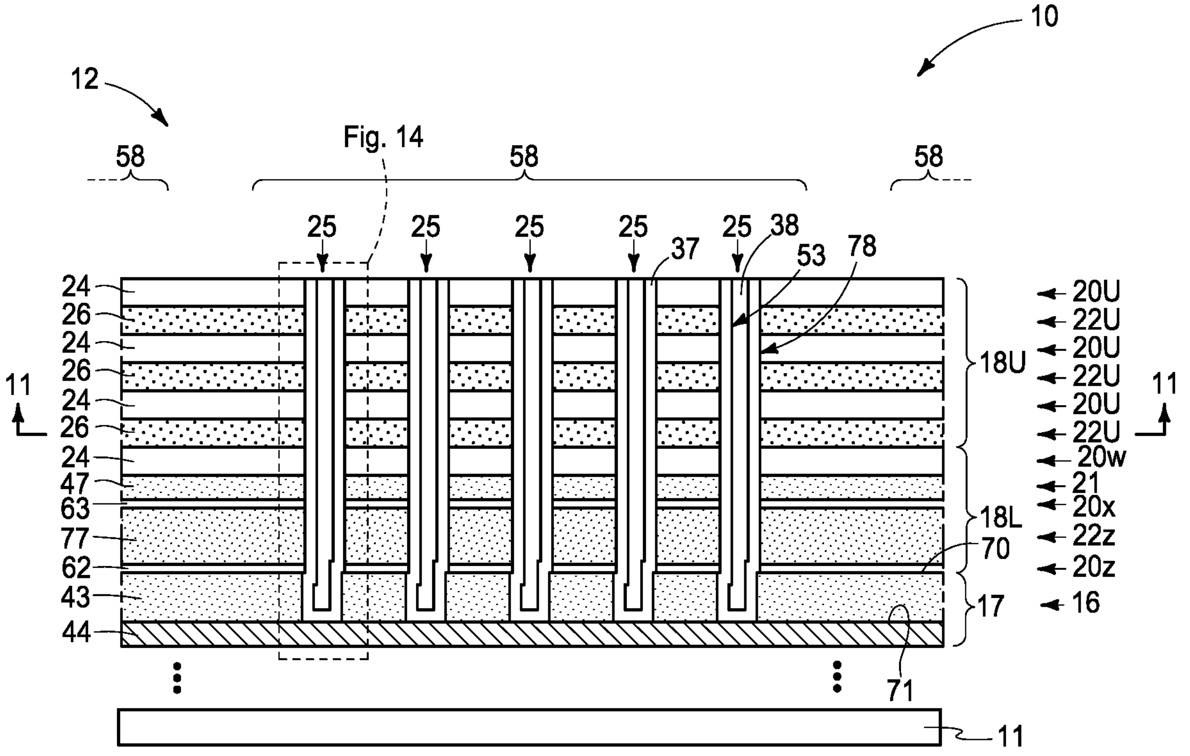
Figure 13:
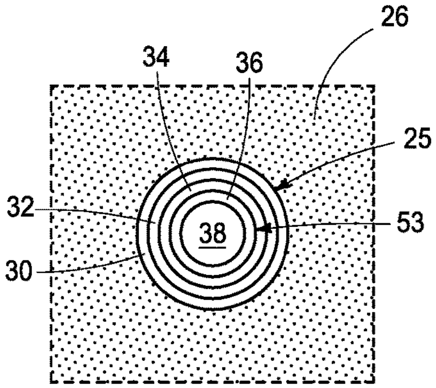
Figure 14:
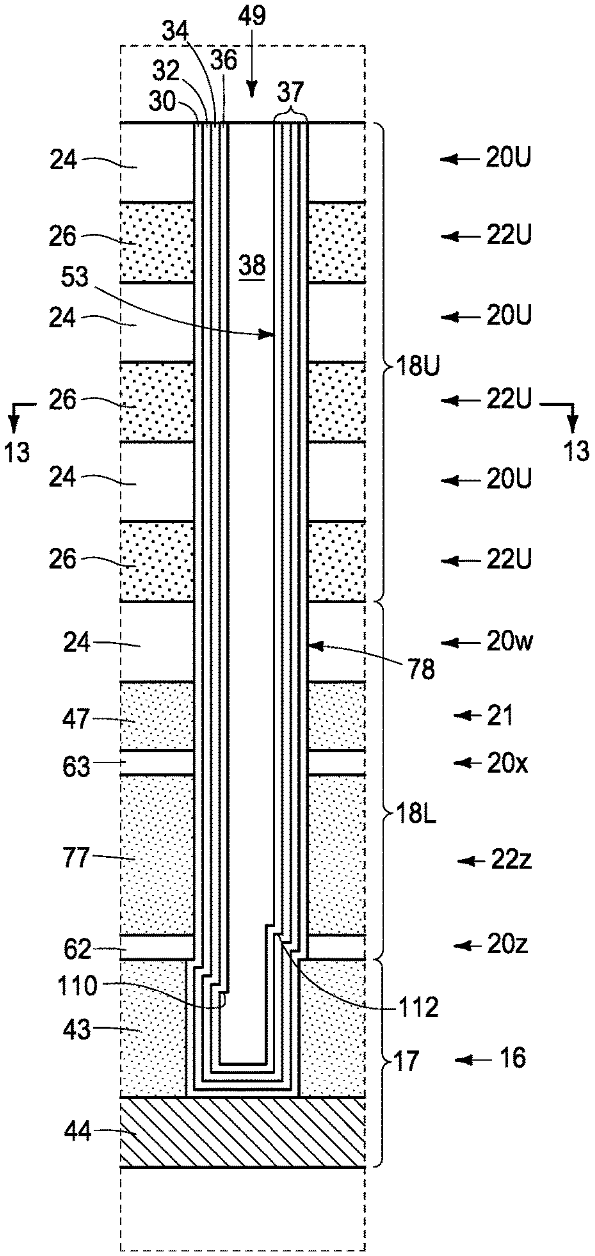

Referring to FIGS. 9 and 10, vertically-alternating first tiers 22U and second tiers 20U of an upper portion 18U of stack 18* have been formed directly above lower portion 18L and sacrificial plugs 75. Example first tiers 22U comprise material 26 that may be sacrificial (e.g., silicon nitride) and of different composition from insulative material 24 of second tiers 20U (e.g., silicon dioxide). First tiers 22U may be conductive and second tiers 20U may be insulative (e.g., comprising silicon dioxide), yet need not be so at this point of processing in conjunction with the hereby initially-described example method embodiment which is "gate-last" or "replacement-gate". Example upper portion 18U is shown starting above lower portion 18L with a first tier 22U although such could alternately start with a second tier 20U (not shown). Further, and by way of example, lower portion 18L may be formed to have one or more first and/or second tiers as a top thereof. Regardless, only a small number of tiers 20U and 22U is shown, with more likely upper portion 18U (and thereby stack 18*) comprising dozens, a hundred or more, etc. of tiers 20* and 22*. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been etched through first and second conductive tiers (22*/20*) of stack 18* (18U and 18L) to sacrificial plugs 75. Channel openings 25 may by somewhat laterally mis-aligned relative to sacrificial plugs 75, for example as shown.

Transistor channel material may be formed in the individual channel openings elevationally along the insulative tiers and the conductive tiers, thus comprising individual channel-material strings, which are directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

Referring to FIGS. 11-14, and in one embodiment and as shown, sacrificial plugs 75 (not shown) have been removed (e.g., by isotropic etching) to extend channel openings 25 to lower conductor material 44. Thereafter, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space (s) (not shown) and/or be devoid of solid material (not shown).

Channel material 36 as a channel-material string 53 of a channel-material-string construction 78 has also been formed in channel openings 25 elevationally along insulative tiers 20 and conductive tiers 22. Accordingly, and as one example as shown, a channel-material-string construction 78 is in individual channel openings 25 and extends to be directly against lower conductor material 44.

Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown).

In one embodiment and as shown, individual channel-material strings 53 of channel-material-string constructions 78 have been formed to comprise external jog surface 112 in a vertical cross-section (e.g., that of FIGS. 12 and 14), and an internal jog surface 110. External jog surface 112 is above conductor tier 16 and internal jog surface 110 is in conductor tier 16. In this document, a "jog surface" is characterized or defined by an abrupt change in direction [at least 15° ] in comparison to surfaces that are immediately-above and immediately-below the jog surface.

Figure 15:
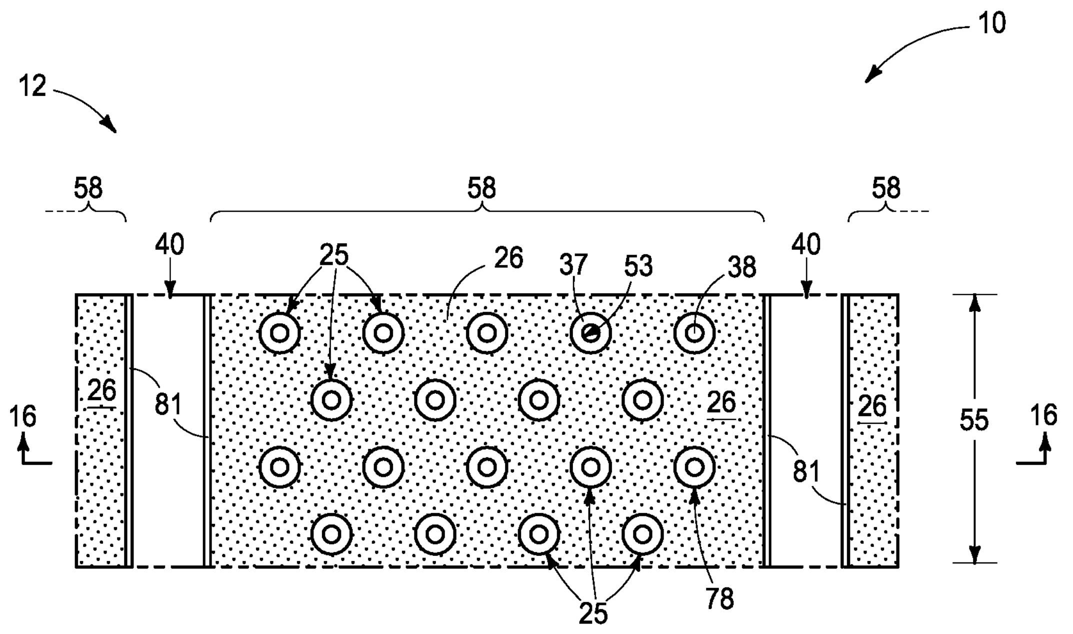
Figure 16:
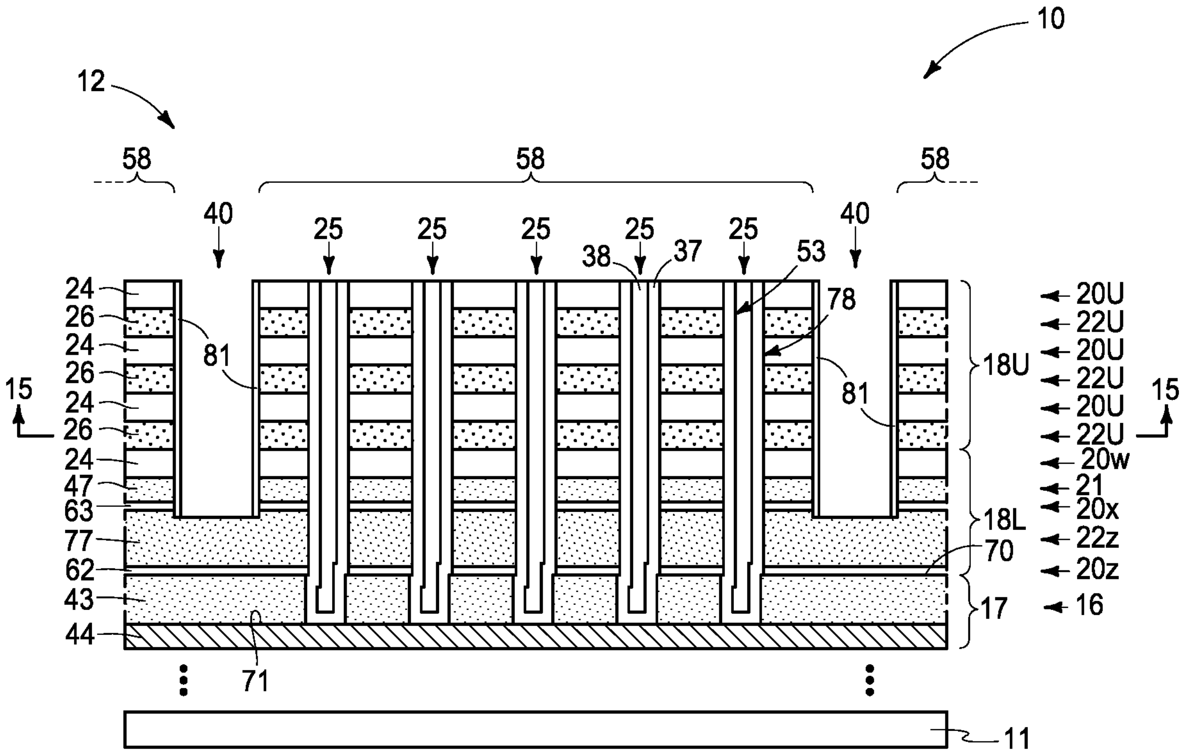

Referring to FIGS. 15 and 16, horizontally-elongated trenches 40 have been formed (e.g., by anisotropic etching) into stack 18* and that are individually between immediately-laterally-adjacent memory-block regions 58. Trenches 40 individually extend through upper portion 18L to lowest first tier 22*z* and expose sacrificial material 77 therein. An optional thin sacrificial liner 81 (e.g., hafnium oxide, aluminum oxide, multiple layers of the same or other materials, [e.g., silicon dioxide and silicon nitride] etc.) has then be formed in trenches 40, followed by punch-etching therethrough to expose sacrificial material 77. Trenches 40 may taper laterally-inward or laterally-outward moving deeper into stack 18* (not shown). By way of example and for brevity only, channel openings 25 are shown as being arranged in groups or columns of staggered rows of four and five channel openings 25 per row. Trenches 40 will typically be wider than channel openings 25 (e.g., 2 to 5 times wider). Any alternate existing or future-developed arrangement and construction may be used. Trenches 40 and channel openings 25 may be formed in any order relative the other or at the same time.

Figure 17:
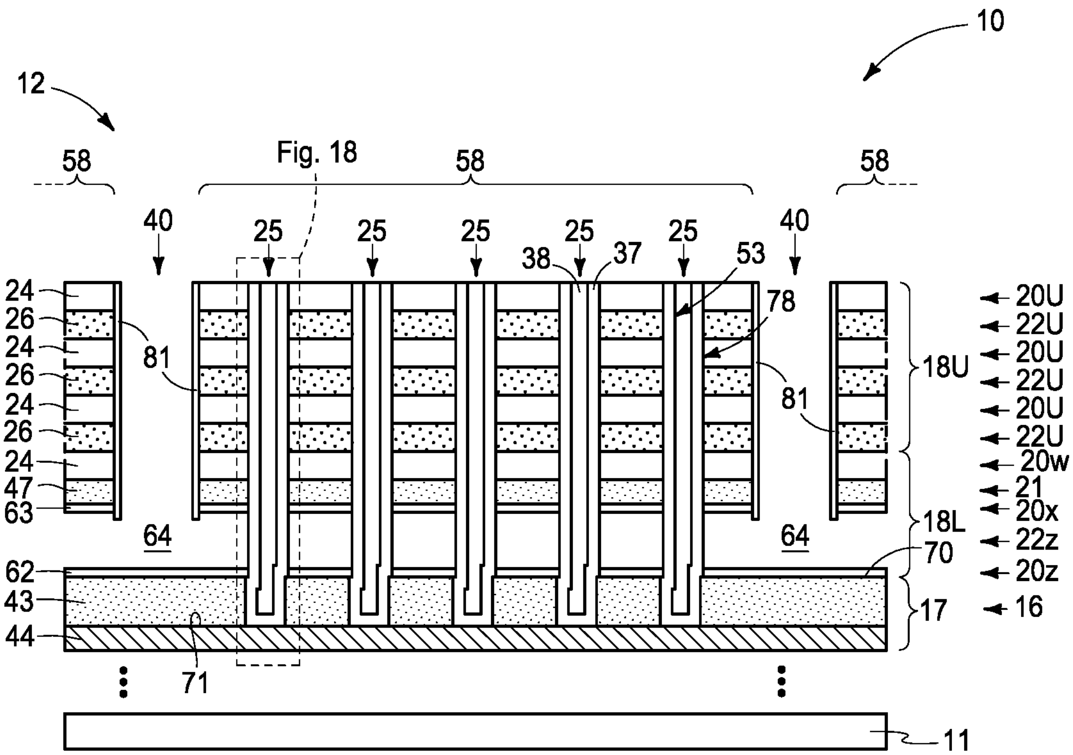
Figure 18:
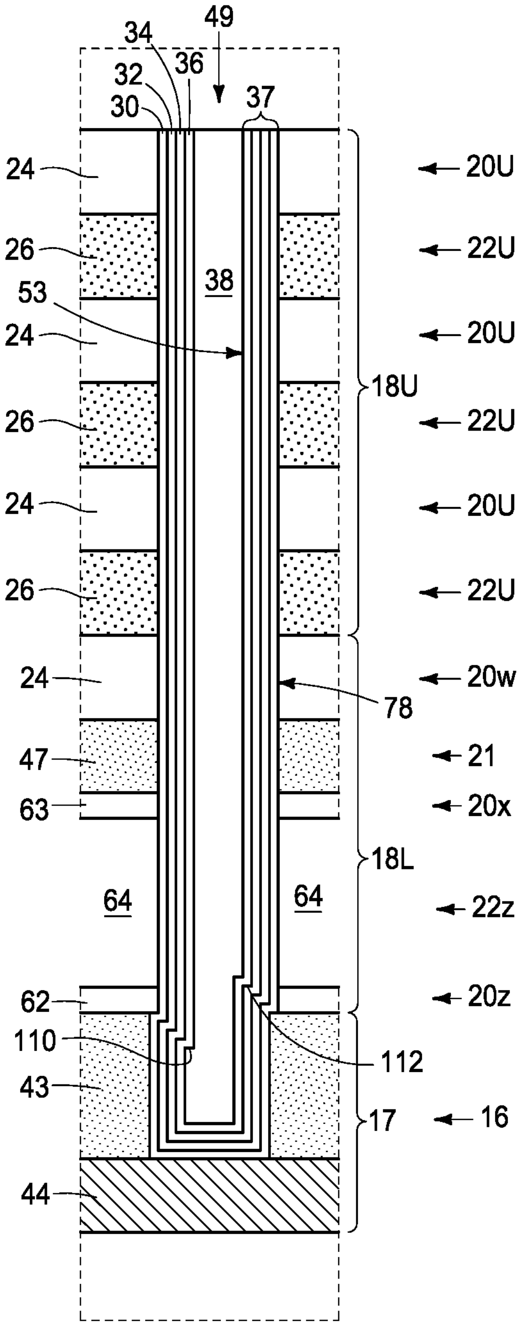

Referring to FIGS. 17 and 18, sacrificial material 77 (not shown) has been removed (e.g., by isotropic etching) from lowest first tier 22*z* through trenches 40, thus leaving or forming a void space 64 vertically between lowest second tier 20*z* and next-lowest second tier 20*x*. Such may occur, for example, by isotropic etching that is ideally conducted selectively relative to materials 62 and 63, for example using liquid or vapor $H_3PO_4$ as a primary etchant where sacrificial material 77 is silicon nitride or using tetramethyl ammonium hydroxide [TMAH] where sacrificial material 77 is polysilicon.

Figure 19:
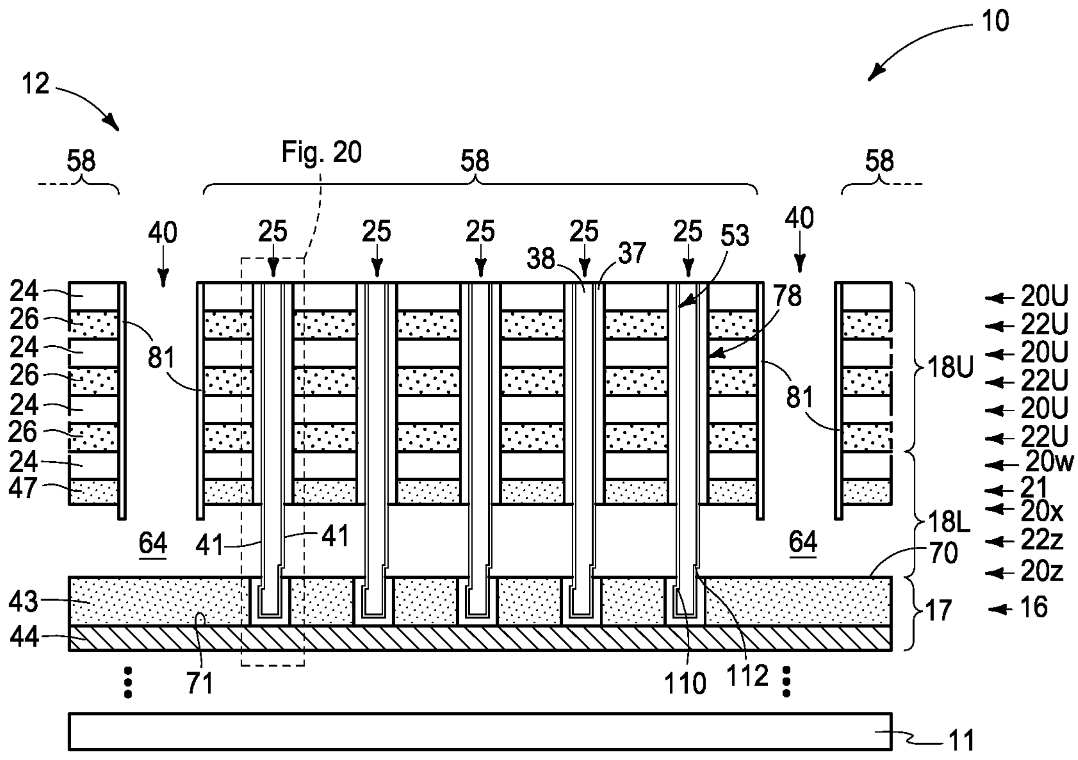
Figure 20:
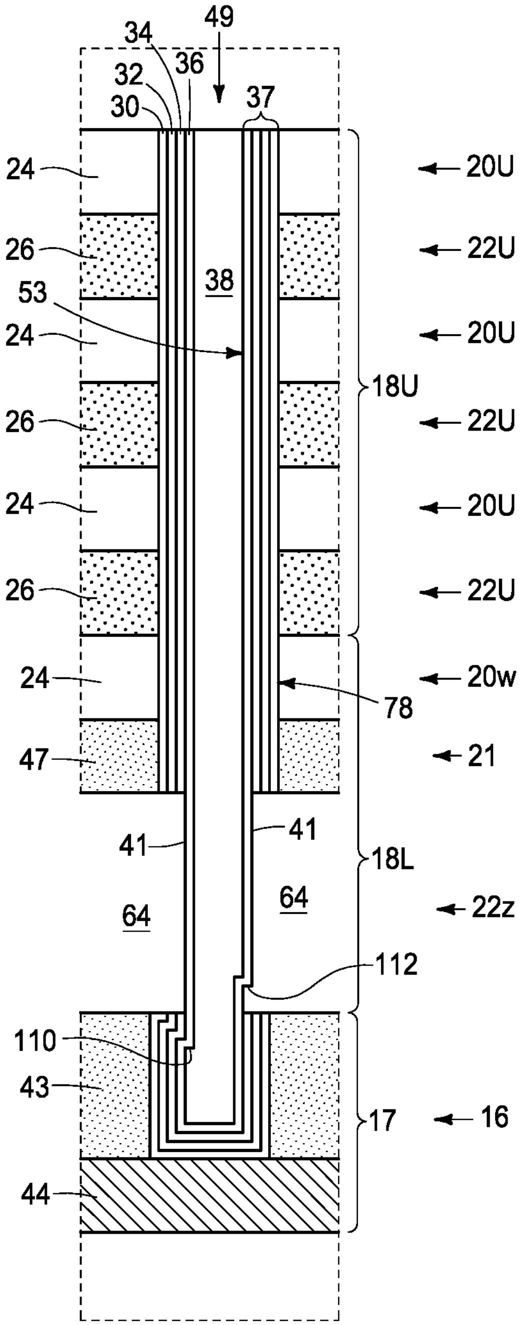

FIGS. 19 and 20 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22*z* to expose a sidewall 41 of channel material 36 of channel-material strings 53 in lowest first tier 22*z*. Any of materials 30, 32, and 34 in tier 22*z* may be considered as being sacrificial material therein. As an example, consider an embodiment where liner 81 is one or more insulative oxides (other than solely silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries may be used in an alternating manner where it is desired to achieve the example depicted construction. In one embodiment and as shown, such etching has been conducted selectively relative to liner 81 (when present). In one embodiment and as shown, materials 62 and 63 (not shown) have been removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. If liner 81 comprises multiple layers of silicon dioxide and silicon nitride, such may be removed (not shown) commensurate with removal (e.g., by etching) of materials 30, 32, 34, 62, and 63 where such collectively comprise silicon nitride and silicon dioxide.

Figure 21:
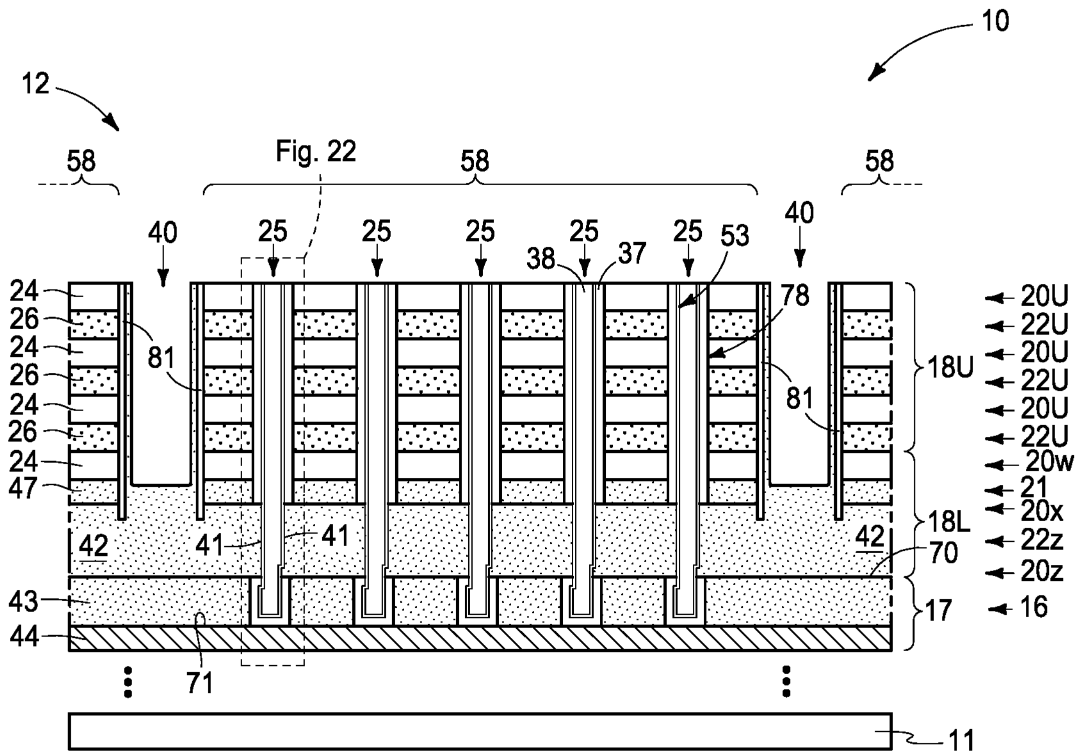
Figure 22:
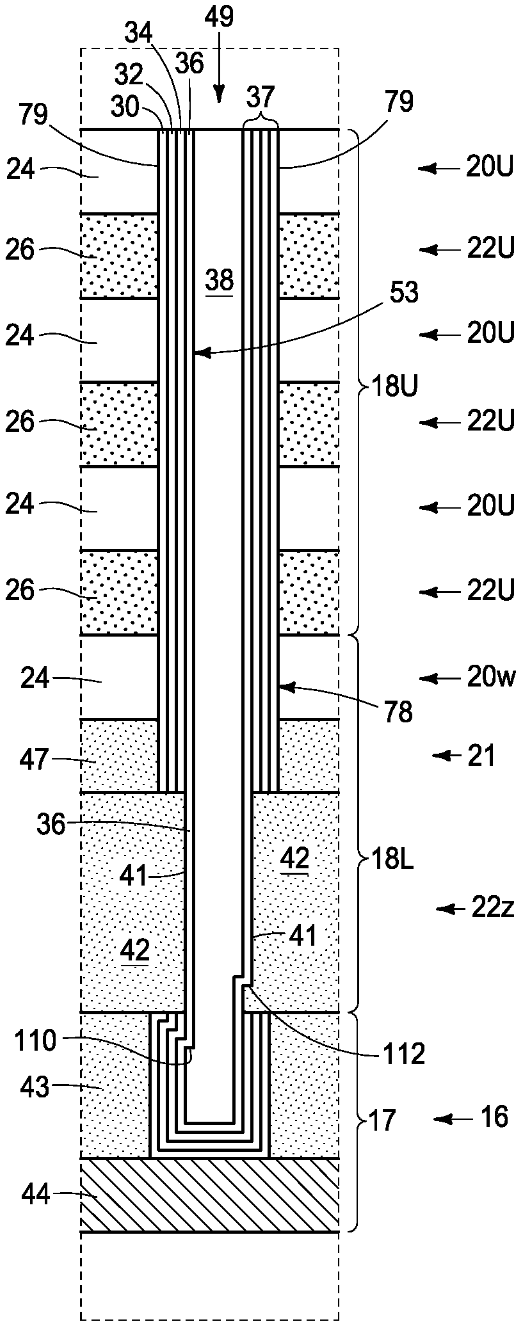
Figure 23:
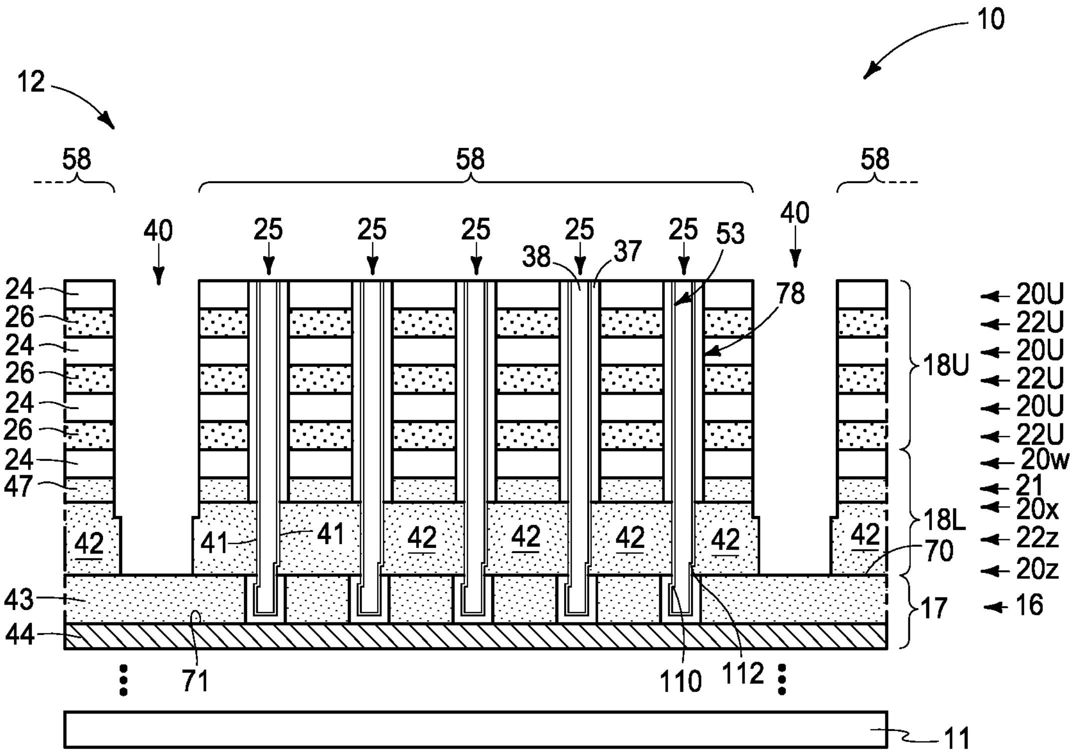
Figure 24:
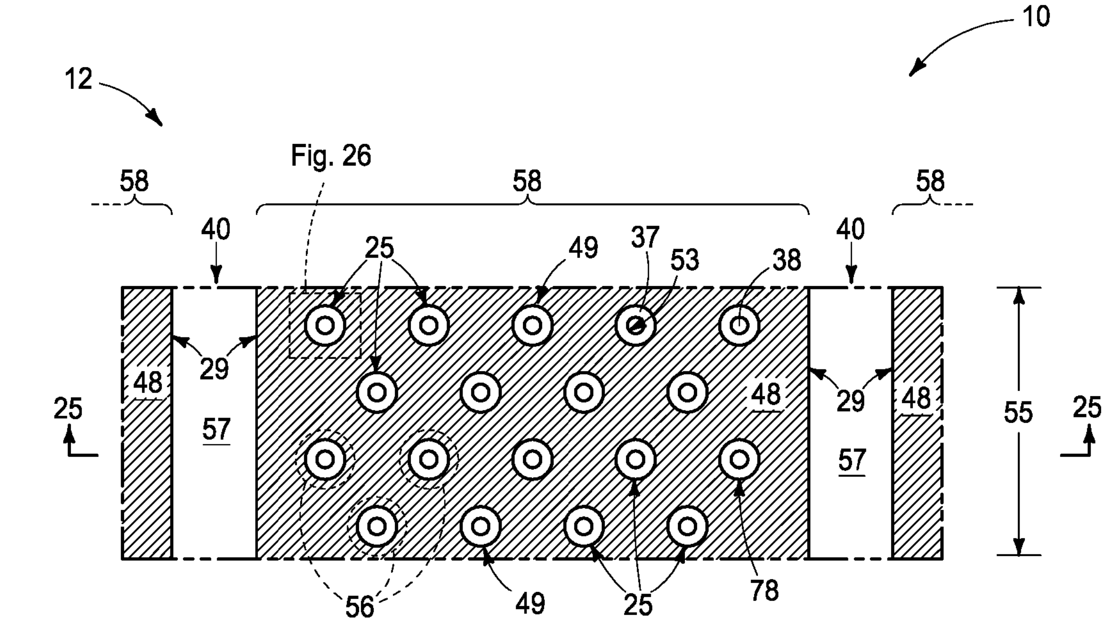
Figure 25:
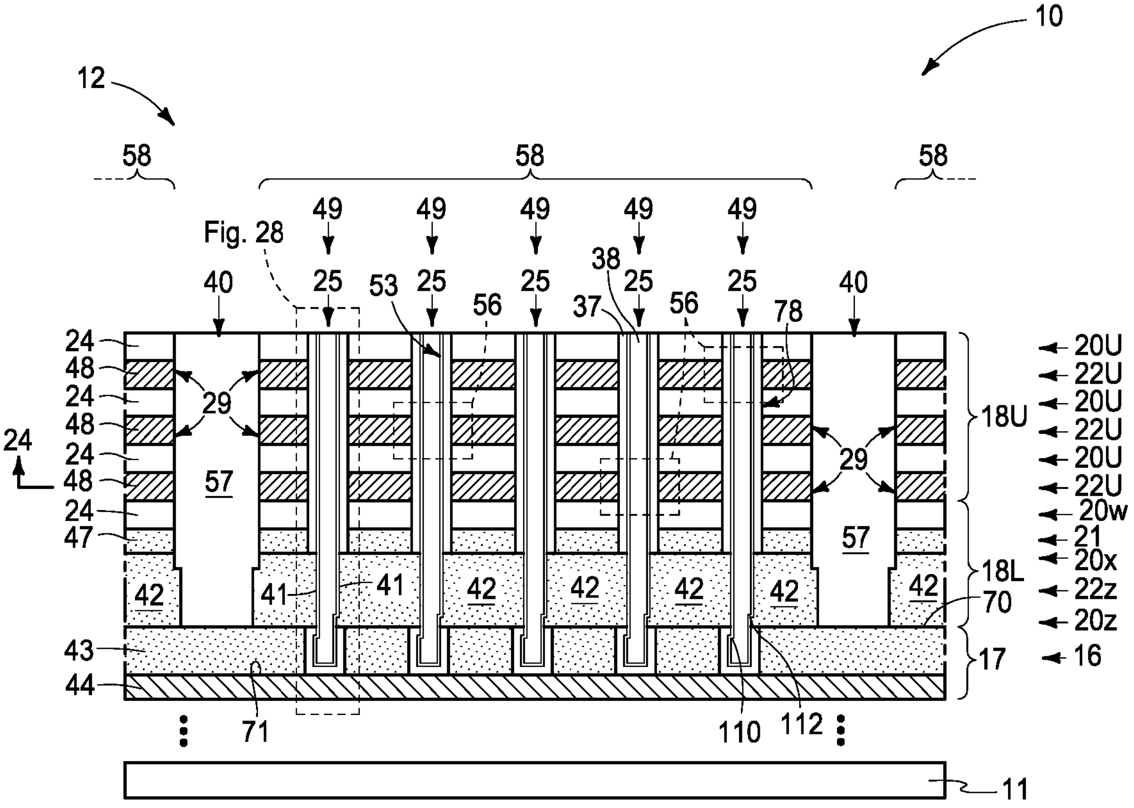
Figure 26:
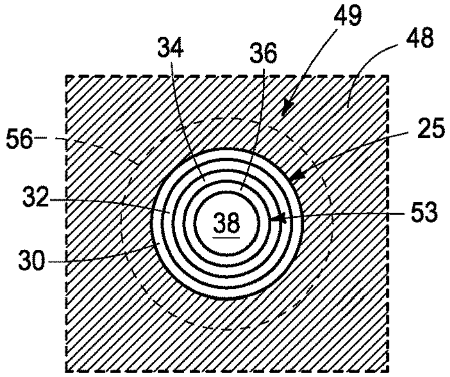
Figure 27:
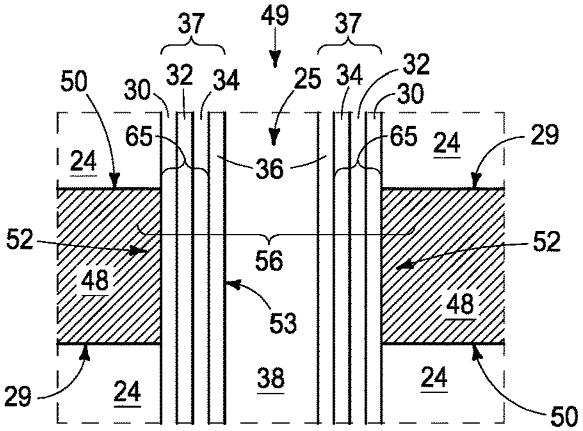
Figure 29:
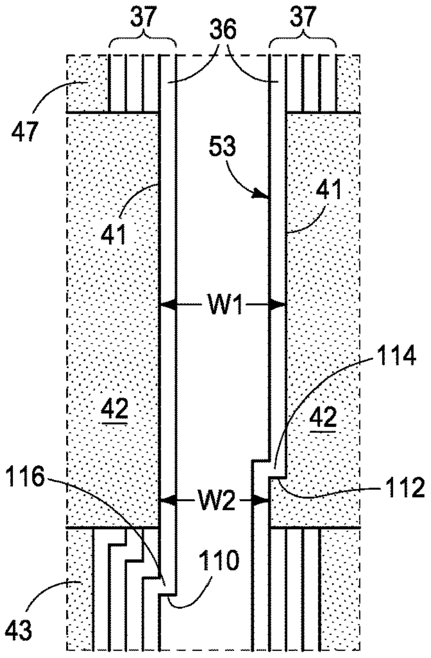
Figure 28:
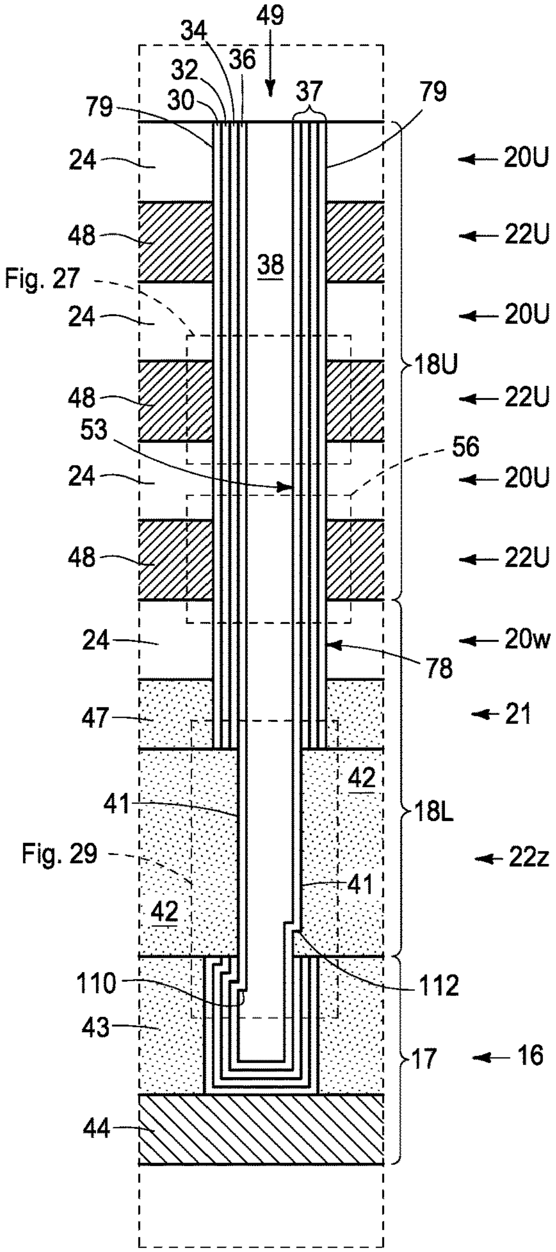

Referring to FIGS. 21 and 22, conducting material 42 (e.g., conductively-doped polysilicon) has been formed in lowest first tier 22*z* and in one embodiment directly against sidewall 41 of channel material 36. In one embodiment and as shown, such has been formed directly against a bottom of conducting material 47 of conducting tier 21 and directly against a top of upper conductor material 43 of conductor tier 16, thereby directly electrically coupling together channel material 36 of individual channel-material strings 53 with upper conductor material 43 of conductor tier 16 and conducting material 47 of conducting tier 21. As shown, conducting material 42 may line and less-than-fill trenches 40 due at least in part to trenches 40 typically being considerably wider than thickness of lowest first tier 22*z*, with deposition of conducting material 42 being stopped after substantial filling of lowest first tier 22*z*. FIG. 23 shows subsequent removal of conducting material 42 from trenches 40 and removal of sacrificial liner 81 (not shown). Sacrificial liner 81 may be removed before forming conducting material 42 (not shown).

Referring to FIGS. 24-29, material 26 (not shown) of conductive tiers 22U has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22U in the example embodiment is sacrificial and has been replaced with conducting material 48, and which has thereafter been removed from trenches 40, thus forming individual conductive lines 29 (e.g., wordlines) and elevationally-extending strings 49 (e.g., strings) of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22* from shorting relative one another in a finished circuitry construction. Example insulative materials are one or more of $SiO_2$, $Si_3N_4$, and $Al_2O_3$. Intervening material 57 may include through array vias (not shown).

Channel-material-string constructions 78 may comprise sidewalls surfaces 79 that are straight through alternating insulative 20U and conductive 22U tiers of the memory array, and above external jog surface 112 which is above top surface 70 of conductor tier 16. Internal jog surface 110 is within conductor tier 16 and below alternating insulative 20U and conductive 22U tiers in the vertical cross-section. In accordance, with example implementations, part 116 and/or part 114 may be horizontal including exactly horizontal (see, e.g., FIG. 29). In one such embodiment and as shown, external jog surface 112 includes part 114 (see, e.g., FIG. 29) that is horizontal in the vertical cross-section (all of such being horizontal and exactly horizontal in the depicted example). In another embodiment where there are two jog surfaces (112/110), internal jog surface includes part 116 that is horizontal in the vertical cross-section. Part 114 of external jog surface 112 is at a different elevation from part 116 of internal jog surface 110.

In one embodiment, individual ones of channel-material strings 53, in a vertical cross-section, comprise external jog surface 112 that is above conductor tier 16, with individual ones of channel-material strings 53, in the vertical cross-section above conductor tier 16 being wider (W1) above external jog surface 112 than below external jog surface 112 (W2).

A motivation for the invention was to improve reliability of direct electrical connection between the channel-material-string constructions 78 and the conductor tier 16.

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprises strings (e.g., 49) of memory cells (e.g., 56). The memory array comprises laterally-spaced memory blocks (e.g., 58) that individually comprise a vertical stack (e.g., 18*) comprising alternating insulative tiers (e.g., 20*) and conductive tiers (e.g., 22*) directly above a conductor tier (e.g., 16). Channel-material strings (e.g., 53) of memory cells (e.g., 56) extend through the insulative tiers and the conductive tiers. The channel material (e.g., 36) of the channel-material strings directly electrically couples to conductor material (e.g., 17) of the conductor tier. Individual ones of the channel-material strings in a vertical cross-section comprise an external jog surface (e.g., 112) that is above the conductor tier and an internal jog surface (e.g., 110) that is in the conductor tier. Any other attribute(s) or aspect(s) as shown and/or described herein with respect to other embodiments may be used.

In one embodiment, a memory array (e.g., 12) comprises strings (e.g., 49) of memory cells (e.g., 56). The memory array comprises laterally-spaced memory blocks (e.g., 58) that individually comprises a vertical stack (e.g., 18*) comprising alternating insulative tiers (e.g., 20*) and conductive tiers (e.g., 22*) directly above a conductor tier (e.g., 16). Channel-material strings (e.g., 53) of memory cells (e.g., 56) extend through the insulative tiers and the conductive tiers. The channel material (e.g., 36) of the channel-material strings directly electrically couples to conductor material (e.g., 17) of the conductor tier. Individual ones of the channel-material strings in a vertical cross-section comprise an external jog surface (e.g., 112) that is above the conductor tier. The individual ones of the channel-material strings in the vertical cross-section and above the conductor tier are wider above the external jog surface than below the external jog surface. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, “elevational”, “higher”, “upper”, “lower”, “top”, “atop”, “bottom”, “above”, “below”, “under”, “beneath”, “up”, and “down” are generally with reference to the vertical direction. “Horizontal” refers to a general direction (i.e., within 10 degrees) along a primary substrate surface and may be relative to which the substrate is processed during fabrication, and vertical is a direction generally orthogonal thereto. Reference to “exactly horizontal” is the direction along the primary substrate surface (i.e., no degrees there-from) and may be relative to which the substrate is processed during fabrication. Further, “vertical” and “horizontal” as used herein are generally perpendicular directions relative one another and independent of orientation of the substrate in three-dimensional space. Additionally, “elevationally-extending” and “extend(ing) elevationally” refer to a direction that is angled away by at least 45° from exactly horizontal. Further, “extend(ing) elevationally”, “elevationally-extending”, “extend(ing) horizontally”, “horizontally-extending” and the like with respect to a field effect transistor are with reference to orientation of the transistor's channel length along which current flows in operation between the source/drain regions. For bipolar junction transistors, “extend(ing) elevationally” “elevationally-extending”, “extend(ing) horizontally”, “horizontally-extending” and the like, are with reference to orientation of the base length along which current flows in operation between the emitter and collector. In some embodiments, any component, feature, and/or region that extends elevationally extends vertically or within 10° of vertical.

Further, “directly above”, “directly below”, and “directly under” require at least some lateral overlap (i.e., horizontally) of two stated regions/materials/components relative one another. Also, use of “above” not preceded by “directly” only requires that some portion of the stated region/material/component that is above the other be elevationally outward of the other (i.e., independent of whether there is any lateral overlap of the two stated regions/materials/components). Analogously, use of “below” and “under” not preceded by “directly” only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, “thickness” by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, “different composition” only requires those portions of two stated materials or regions that may be directly against one another to be chemically and/or physically different, for example if such materials or regions are not homogenous. If the two stated materials or regions are not directly against one another, “different composition” only requires that those portions of the two stated materials or regions that are closest to one another be chemically and/or physically different if such materials or regions are not homogenous. In this document, a material, region, or structure is “directly against” another when there is at least some physical touching contact of the stated materials, regions, or structures relative one another. In contrast, “over”, “on”, “adjacent”, “along”, and “against” not preceded by “directly” encompass “directly against” as well as construction where intervening material(s), region(s), or structure(s) result(s) in no physical touching contact of the stated materials, regions, or structures relative one another.

Herein, regions-materials-components are “electrically coupled” relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being “directly electrically coupled”, no intervening electronic component (e.g., no diode, transistor, resistor, transducer, switch, fuse, etc.) is between the directly electrically coupled regions-materials-components.

Any use of “row” and “column” in this document is for convenience in distinguishing one series or orientation of features from another series or orientation of features and along which components have been or may be formed. “Row” and “column” are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. “Metal material” is any one or combination of an elemental metal, any mixture or alloy of two or more elemental metals, and any one or more metallic compound(s).

Herein, any use of “selective” as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of “or” herein encompasses either and both.

CONCLUSION

In some embodiments, a method used in forming a memory array comprising strings of memory cells comprises forming a conductor tier comprising conductor material on a substrate. The conductor tier has a top surface comprising the conductor material. The conductor tier comprises sacrificial plugs in locations where individual channel-material strings will be formed. The sacrificial plugs individually have a top surface that is at or below the top surface of the conductor tier and is of different composition from an upper portion of the conductor material. Laterally-spaced memory-block regions are formed that individually comprise a vertical stack comprising alternating first tiers and second tiers directly above the conductor tier. Material of the first tiers is of different composition from material of the second tiers. Channel openings are etched through the first tiers and the second tiers to the sacrificial plugs. The sacrificial plugs are removed and thereafter a channel-material string is formed in individual ones of the channel openings. The channel material of the channel-material string directly electrically couples to the conductor material in the conductor tier.

In some embodiments, a method used in forming a memory array comprising strings of memory cells comprises forming a conductor tier comprising conductor material on a substrate. The conductor material comprises upper conductor material directly above lower conductor material that is of different composition from the upper conductor material. The upper conductor material has a top surface. Sacrificial plugs are formed in the conductor tier in locations where individual channel-material strings will be formed. The sacrificial plugs are of different composition from the upper conductor material. The sacrificial plugs individually have a top surface that is at or below the top surface of the upper conductor material. The sacrificial plugs individually have a bottom surface that is at or above a top surface of the lower conductor material. Laterally-spaced memory-block regions are formed that individually comprise a vertical stack comprising alternating first tiers and second tiers directly above the conductor tier. Material of the first tiers is of different composition from material of the second tiers. Channel openings are etched through the first tiers and the second tiers to the sacrificial plugs. The sacrificial plugs are removed and thereafter a channel-material string is formed in individual ones of the channel openings and that extends into the conductor tier. The channel material of the channel-material string directly electrically couples to the conductor material in the conductor tier.

In some embodiments, a method used in forming a memory array comprising strings of memory cells comprises forming a conductor tier comprising conductor material on a substrate. The conductor tier has a top surface that comprises the conductor material. Sacrificial plugs are formed in locations where individual channel-material strings will be formed. The sacrificial plugs individually have a top surface that is at or below the top surface of the conductor tier and is of different composition from an upper portion of the conductor material. A lower portion of a stack is formed that will comprise vertically-alternating first tiers and second tiers directly above the conductor tier and the sacrificial plugs. The stack comprises laterally-spaced memory-block regions. Material of the first tiers is of different composition from material of the second tiers. A lowest of the first tiers comprises sacrificial material. The vertically-alternating first tiers and second tiers of an upper portion of the stack are formed directly above the lower portion and the sacrificial plugs. Channel openings are etched through the first tiers and the second tiers to the sacrificial plugs. The sacrificial plugs are removed through the channel openings. After removing the sacrificial plugs, a channel-material-string construction is formed in individual ones of the channel openings. Horizontally-elongated trenches are formed into the stack that are individually laterally-between immediately-laterally-adjacent of the memory-block regions. The trenches extend through the upper portion to the lowest first tier and expose the sacrificial material therein. The exposed sacrificial material is isotropically etched from the lowest first tier through the trenches. After the isotropic etching, conductive material is formed in the lowest first tier that directly electrically couples together the channel material of the channel-material-string construction and the conductor material of the conductor tier.

In some embodiments, a memory array comprises strings of memory cells. The memory array comprises laterally-spaced memory blocks that individually comprise a vertical stack comprising alternating insulative tiers and conductive tiers directly above a conductor tier. Channel-material strings of memory cells extend through the insulative tiers and the conductive tiers. The channel material of the channel-material strings directly electrically couples to conductor material of the conductor tier. Individual ones of the channel-material strings in a vertical cross-section comprise an external jog surface that is above the conductor tier and an internal jog surface that is in the conductor tier.

In some embodiments, a memory array comprises strings of memory cells. The memory array comprises laterally-spaced memory blocks that individually comprise a vertical stack comprising alternating insulative tiers and conductive tiers directly above a conductor tier. Channel-material strings of memory cells extend through the insulative tiers and the conductive tiers. The channel material of the channel-material strings directly electrically couples to conductor material of the conductor tier. Individual ones of the channel-material strings in a vertical cross-section comprise an external jog surface that is above the conductor tier. The individual ones of the channel-material strings in the vertical cross-section and above the conductor tier are wider above the external jog surface than below the external jog surface.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:

forming a conductor tier comprising conductor material on a substrate, the conductor tier having a top surface comprising the conductor material;

forming sacrificial plugs in locations where individual channel-material strings will be formed, the sacrificial plugs individually having a top surface that is at or below the top surface of the conductor tier and being of different composition from an upper portion of the conductor material;

forming a lower portion of a stack that will comprise vertically-alternating first tiers and second tiers directly above the conductor tier and the sacrificial plugs, the stack comprising laterally-spaced memory-block regions, material of the first tiers being of different composition from material of the second tiers, a lowest of the first tiers comprising sacrificial material;

forming the vertically-alternating first tiers and second tiers of an upper portion of the stack directly above the lower portion and the sacrificial plugs;

etching channel openings through the first tiers and the second tiers to the sacrificial plugs;

removing the sacrificial plugs through the channel openings;

after removing the sacrificial plugs, forming a channel-material-string construction in individual ones of the channel openings;

forming horizontally-elongated trenches into the stack that are individually laterally-between immediately-laterally-adjacent of the memory-block regions, the trenches extending through the upper portion of the stack to the lowest first tier and exposing the sacrificial material therein;

isotropically etching the exposed sacrificial material from the lowest first tier through the trenches; and after the isotropically etching, forming conductive material in the lowest first tier that directly electrically couples together the channel material of the channel-material-string construction and the conductor material of the conductor tier.

2. The method of claim 1 wherein the top surface of individual ones of the sacrificial plugs is at the top surface of the conductor tier.

3. The method of claim 2 wherein the top surface of the individual ones of the sacrificial plugs is planar.

4. The method of claim 3 wherein the top surface of the conductor tier is planar immediately-adjacent the sacrificial plugs, the top surface of the individual ones of the sacrificial plugs being coplanar with the planar top surface of the conductor tier.

5. The method of claim 1 wherein the top surface of individual ones of the sacrificial plugs is below the top surface of the conductor tier.

6. The method of claim 1 wherein the composition of the sacrificial plugs comprises one or more of W, BPSG, and AlOx.

7. The method of claim 1 wherein the composition of the upper portion of the conductor material comprises conductively-doped semiconductive material.

8. The method of claim 1 wherein the conductor material comprises conductively-doped semiconductive material directly above and directly against metal material, the sacrificial plugs being formed to have a portion above a top surface of the metal material.

9. The method of claim 1 wherein the conductor material comprises conductively-doped semiconductive material directly above and directly against metal material, the sacrificial plugs being formed to have a portion directly against a top surface of the metal material.

10. The method of claim 1 further comprising recessing the sacrificial plugs to have a top surface that is below the top surface of the conductor tier.

11. The method of claim 1 wherein one or more of the sacrificial plugs comprises two different compositions.

12. The method of claim 11 wherein one of the two different compositions are sidewalls of at least one of the sacrificial plugs, and the other of the two different compositions are between the sidewalls of the at least one of the sacrificial plugs.

* * * * *